United States Patent
Goi et al.

(10) Patent No.: US 7,978,031 B2
(45) Date of Patent: Jul. 12, 2011

(54) HIGH FREQUENCY MODULE PROVIDED WITH POWER AMPLIFIER

(75) Inventors: Tomoyuki Goi, Tokyo (JP); Takuya Adachi, Tokyo (JP); Atsuhi Ajioka, Tokyo (JP); Hitoshi Hachiga, Tokyo (JP)

(73) Assignee: TDK Corporation, Tokyo (JP)

( * ) Notice: Subject to any disclaimer, the term of this patent is extended or adjusted under 35 U.S.C. 154(b) by 241 days.

(21) Appl. No.: 12/353,873

(22) Filed: Jan. 14, 2009

(65) Prior Publication Data

US 2009/0195334 A1 Aug. 6, 2009

(30) Foreign Application Priority Data

Jan. 31, 2008 (JP) ................................. 2008-022150
Jan. 31, 2008 (JP) ................................. 2008-022151
Jan. 31, 2008 (JP) ................................. 2008-022152

(51) Int. Cl.
*H05K 1/18* (2006.01)
(52) U.S. Cl. ...................................... 333/247; 361/761
(58) Field of Classification Search .................. 333/247; 361/761–766, 782; 257/728
See application file for complete search history.

(56) References Cited

U.S. PATENT DOCUMENTS

| | | | |
|---|---|---|---|
| 2006/0094393 A1 | 5/2006 | Okuyama et al. | |
| 2006/0117163 A1 | 6/2006 | Okuyama et al. | |
| 2007/0076392 A1* | 4/2007 | Urashima et al. | 361/763 |

FOREIGN PATENT DOCUMENTS

| | | |
|---|---|---|
| EP | 1990864 A1 | 11/2008 |
| JP | 2002-222729 | 8/2002 |
| JP | 2004-235877 | 8/2004 |
| JP | 2005-045447 | 2/2005 |
| JP | 2005-101893 | 4/2005 |
| JP | 2005-123909 | 5/2005 |
| JP | 2005-244336 | 9/2005 |
| JP | 2006-121147 | 5/2006 |
| JP | 2006-140862 | 6/2006 |
| JP | 2006-157880 | 6/2006 |
| JP | 2007-235435 | 9/2007 |
| JP | 2007-335764 | 12/2007 |

OTHER PUBLICATIONS

Office Action dated Jan. 5, 2010 in related JP application 2008-022152, with translation/.

* cited by examiner

*Primary Examiner* — Stephen E Jones
(74) *Attorney, Agent, or Firm* — Young Law Firm, P.C.

(57) ABSTRACT

The present invention is provided with a high frequency module comprising a multilayered substrate, a power amplifier IC mounted on the upper surface of the multilayered substrate, first and second filters disposed substantially directly below the power amplifier IC in an inner layer of the multilayered substrate, and coupling-reducing ground vias disposed between the first filter and the second filter. At least the first filter is disposed substantially directly below the power amplifier IC. The coupling-reducing ground vias double as thermal vias for dissipating heat generated by the power amplifier IC.

18 Claims, 6 Drawing Sheets

FIG. 1

FIG. 2B Bottom layer

FIG. 2A Top layer

HIGH FREQUENCY MODULE PROVIDED WITH POWER AMPLIFIER

TECHNICAL FIELD

The present invention relates to a high frequency module that is preferably used in a mobile phone, wireless LAN, and other wireless communication devices, and particularly relates to a high frequency module provided with a power amplifier.

BACKGROUND OF THE INVENTION

Mobile phones, wireless LANs, and other wireless communication devices are provided with a high frequency circuit, and a power amplifier is used in the high frequency circuit. A power amplifier is a component required in a transmitting circuit of a communication device. In recent years in particular, it is expected that a wireless LAN function is mounted in a mobile phone, and there is a need for smaller-sized high frequency circuits. In view of this need, a high frequency module in which a power amplifier and a filter disposed in the pre- and post-stages are integrally formed in the high frequency circuit.

Figure 5:
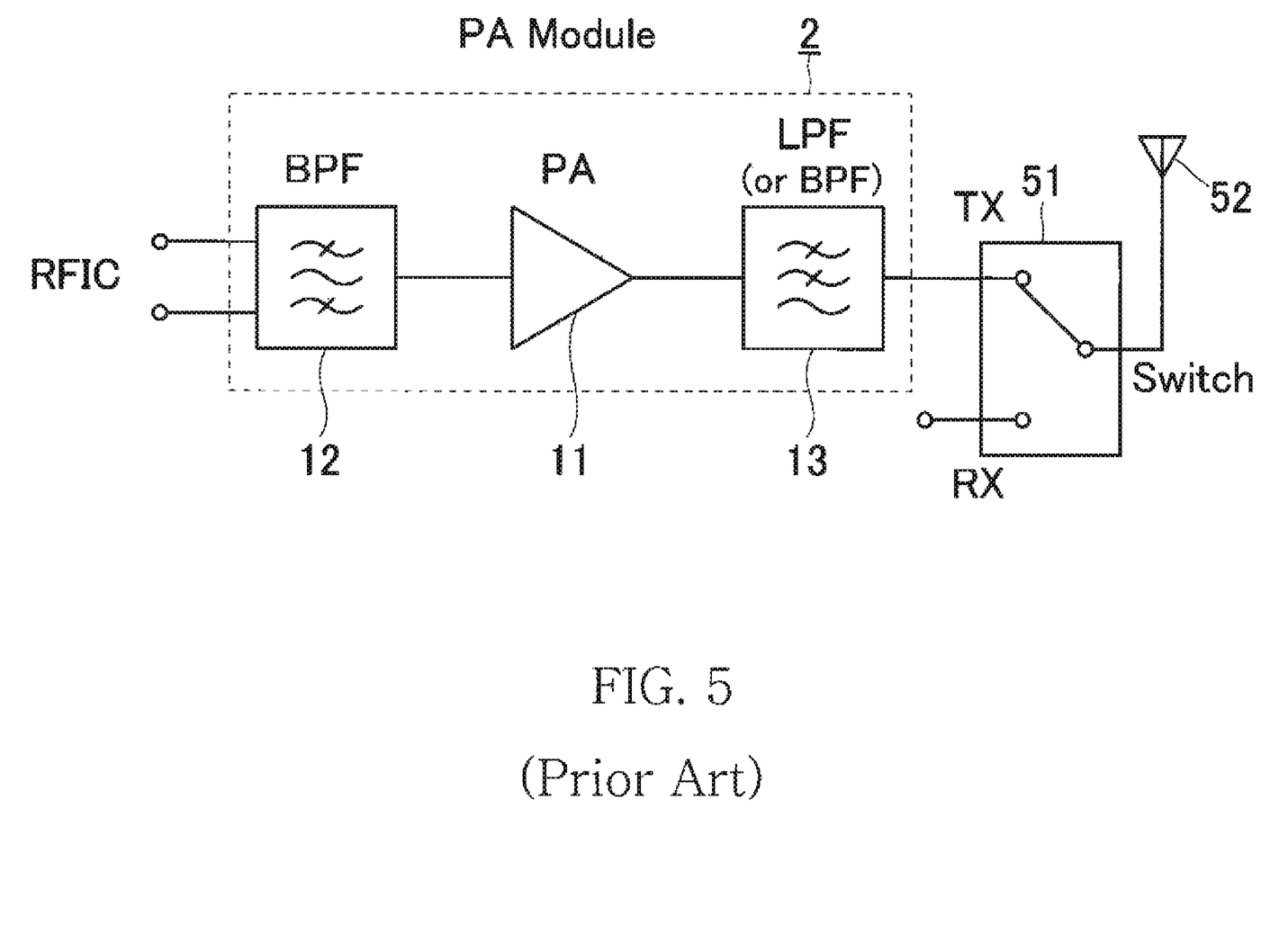
FIG. 5 is a block diagram showing an example of the configuration of a high frequency module.

FIG. 5 is a block diagram showing an example of the configuration of a high frequency module.

As shown in FIG. 5, a high frequency module 2 is composed of a power amplifier 11, a first filler 12 disposed in the pre-stage of the power amplifier 11, and a second filter 13 disposed in the post-stage of the power amplifier 11. An input end of the high frequency module 2 is connected to a transceiver IC (RFIC) of the high frequency circuit, and an output end is connected to an antenna 52 by way of an antenna switch 51. The first filter 12 is a band-pass filter (BPF) for removing spurious signals generated in a mixer in the RFIC, and the second filter 13 is a low-pass filter (LPF) or a band-pass filter for suppressing spurious signals of a multiplication wave generated in the power amplifier 11 (see Japanese Laid-open Patent Application No. 2005-101893).

Since the RFIC disposed in the pre-stage of the high frequency module 2 has a balanced output, the high frequency module 2 must also be provided with balanced input. In a conventional high frequency module 2, a balance to unbalance conversion is carried out using a balun and a connection is made to the power amplifier 11 by way of the first filter 12, which is a band-pass filter. However, in recent years, a so-called balance filter having a balun function is often used (see Japanese Laid-open Patent Application No. 2005-45447).

Figure 6:
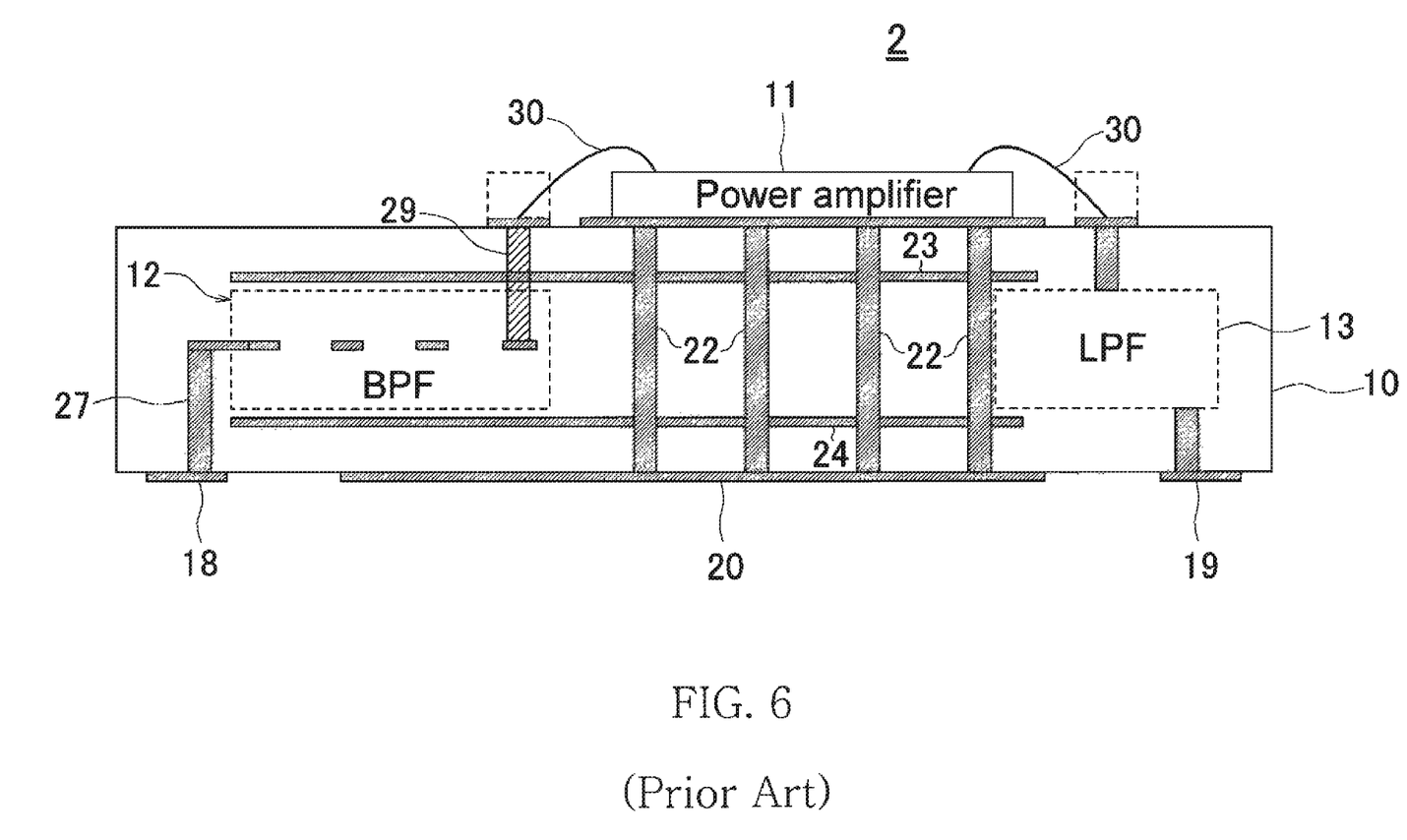
FIG. 6 is a schematic cross-sectional view showing a conventional structure of the high frequency module.

FIG. 6 is a schematic cross-sectional view showing a conventional structure of the high frequency module 2.

As shown in FIG. 6, the high frequency module 2 is provided with a multilayered substrate 10, a power amplifier IC 11 mounted on an upper surface of the multilayered substrate 10, first and second filters 12, 13 formed on an inner layer of the multilayered substrate 10. Thermal vias 22 are disposed directly below the power amplifier IC 11, and the thermal vias 22 are formed completely through the multilayered substrate 10 in the vertical direction and are connected to the power amplifier IC 11 and the ground terminals 20 on the bottom surface of the substrate (see Japanese Laid-open Patent Application Nos. 2006-121147 and 2005-123909).

Ground patterns 23, 24 are disposed on an inner layer of the multi layered substrate 10, and the ground patterns 23, 24 are connected to the thermal vias 22. The input end of the first filter 12 of the inner layer is connected to the high frequency module input terminal 18 by way of a via hole, and the output end of the second filter 13 is connected to a high frequency module output terminal 19 by way of a via hole.

Examples of other prior arts include a structure for separating electromagnetic coupling between different bands or the connection between transceiver circuits using ground vias and patterns (see Japanese Laid-open Patent Application Nos. 2006-140862, 2004-235877, 2005-244336), a structure in which interference-preventing ground parts are disposed between an surface acoustic wave device (filter) and the power amplifier mounted on the surface of a dielectric substrate (see Japanese Laid-open Patent Application No. 2005-244336). Also known is a large-scale high frequency module in which the RF antenna switch circuit and a plurality of diplexers are integrated (see Japanese Laid-open Patent Application No. 2006-157880). Also known is a dipole resonance filter having two inductor electrodes or a tripole resonance filter having three inductor electrodes as a filter incorporated into a nigh frequency module (see Japanese Laid-open Patent Application No. 2007-235435).

As described above, thermal vias for dissipating heat are required because the power consumption of a power amplifier is considerable and the amount of generated heat is also considerable. Conventionally, other circuits and wiring cannot be disposed directly below the power amplifier IC 11 and there is a negative effect in relation to reducing the size of the high frequency module because the thermal vias 22 are disposed in a position facing the lower surface of the power amplifier IC 11. Also, it is preferred that the wiring of each filter be shortened as much as possible in order to prevent degradation of insertion loss, and it is also preferred that each filter be disposed in the vicinity of the power amplifier, but the presence of thermal vias prevents such efforts.

On the other hand, there is a problem in that the spacing between the first filter and second filter disposed in the pre-stage and post-stage of the power amplifier are brought closer together as the high frequency module is made smaller, the filters become electromagnetically coupled, and isolation is reduced. When isolation between the filters is low in comparison with the gain of the power amplifier, there is a problem in that feedback is applied to the power amplifier by way of the pre- and post-filters, the operation of the power amplifier becomes unstable, and in the worst case, the power amplifier oscillates.

SUMMARY OF THE INVENTION

It is therefore an object of the present invention to provide a small, high-performance high frequency module while maintaining heat-dissipating properties and stable operation of the power amplifier.

In order to solve the above-described problems, the high frequency module of the present invention comprises: a multilayered substrate; a power amplifier IC mounted on the upper surface of the multilayered substrate; first and second filters disposed substantially directly below the power amplifier IC in an inner layer of the multilayered substrate; and coupling-reducing ground vias disposed between the first filter and the second filter, wherein the coupling-reducing ground vias double as thermal vias for dissipating heat generated by the power amplifier IC. As used herein, the term "ground via" is refers to a via hole connected to the ground electrode pattern, and the term "thermal via" is refers to a via hole mainly used for dissipating heat. Also, a via hole is not merely a through-hole, but is a hole that includes a conductor for obtaining interlayer electrical conductance. The conductor may be formed on an inner surface of the through hole and may be completely embedded in the through hole.

In accordance with the present invention, the first and second filters are disposed substantially directly below the power amplifier IC, and the coupling-reducing ground vias between the filters double as the thermal vias of the power amplifier IC. Accordingly, isolation is not reduced even when the first and second filters are proximately disposed. Therefore, the entire module can be reduced in size while maintaining the stability of the operation of the power amplifier and the heat-dissipating properties of the power amplifier.

It is preferred that the high frequency module according to the present invention further comprise a ground pattern formed in an inner layer of the multilayered substrate, wherein the coupling-reducing ground vias are connected to the ground pattern. In the present invention, it is preferred that the first filter is connected to an input end of the power amplifier IC, and the second filter be connected to an output end of the power amplifier IC.

In the present invention, it is preferred that the first filter be composed of a ¼ wavelength ($\lambda/4$) resonator in which an interdigital electrode is used. In accordance with a $\lambda/4$ wavelength resonator in which an interdigital electrode (hereinbelow simply referred to as an interdigital $\lambda/4$ resonator) is used, a small, high-performance balance band-pass filter can be achieved, and is easily incorporated into a multilayered substrate. Since the interdigital $\lambda/4$ resonator constituting the first filter has numerous ground vias on the structure, the total number of via holes can be reduced by using the ground vias as power amplifier thermal vias, and the high frequency module can be reduced in size. A smaller structure is facilitated and balance characteristics of a balance signal are also excellent in comparison with the case that a ½ wavelength resonator is used, or the case in which two simple ¼ wavelength resonators that are not interdigitally coupled are used, because the interdigital $\lambda/4$ resonator has a pair of balance terminals connected to a pair of interdigitally coupled ¼ resonators. The interdigital $\lambda/4$ resonator has ground vias and an interdigital electrode, and heat is transferred to the multilayered substrate by way of numerous electrode patterns constituting the interdigital electrode, whereby heat is dispersed. Therefore, a heat-dissipating effect by way of the interdigital electrode can be obtained.

The above and other object of the present invention can also be accomplished by a high frequency module comprising: a multilayered substrate; a power amplifier IC mounted on the upper surface of the multilayered substrate; a first filter disposed substantially directly below the power amplifier IC in an inner layer of the multilayered substrate, wherein the first filter has a plurality of ground vias, and the ground vias double as thermal vias for dissipating heat generated by the power amplifier IC.

Further, the above and other object of the present invention can also be accomplished by a high frequency module comprising: a multilayered substrate; a power amplifier IC mounted on the upper surface of the multilayered substrate; a first filter disposed substantially directly below the power amplifier IC in an inner layer of the multilayered substrate; and a wiring pattern provided in an inner layer of the multilayered substrate and connecting between the output end of the first filter and the input end of the power amplifier, wherein the wiring pattern is disposed substantially directly below the power amplifier IC.

In this manner, in accordance with the present invention, a small, high-performance high frequency module can be provided while maintaining heat-dissipating properties and stable operation of the power amplifier.

BRIEF DESCRIPTION OF THE DRAWINGS

The above and other objects, features and advantages of this invention will become more apparent by reference to the following detailed description of the invention taken in conjunction with the accompanying drawings, wherein.

DESCRIPTION OF THE PREFERRED EMBODIMENTS

Preferred embodiments of the present invention will be described in detail hereinafter with reference to the accompanying drawings.

Figure 1:
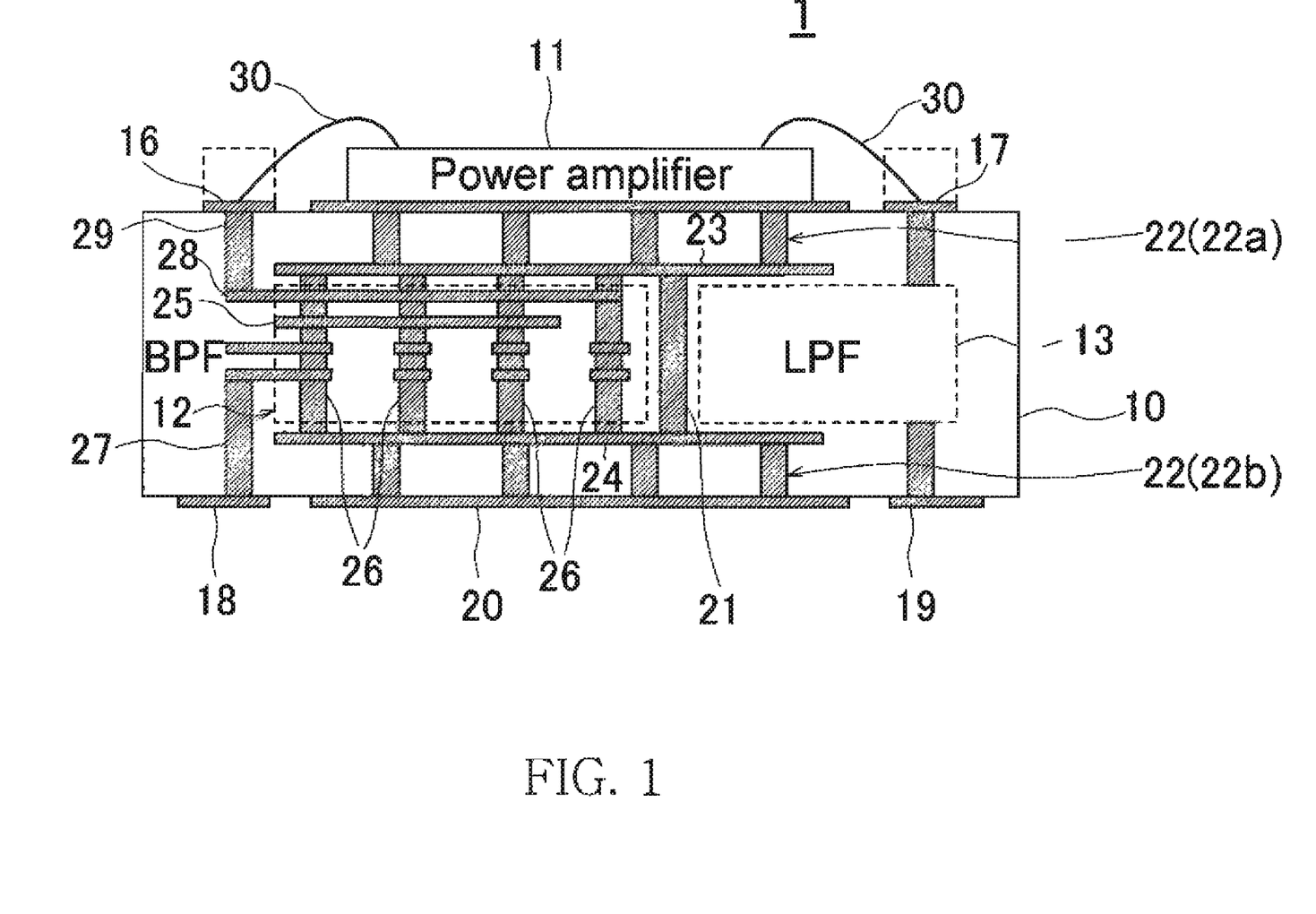
FIG. 1 is a schematic cross-sectional view showing the structure of a high frequency module of a preferred embodiment of the present invention.

FIG. 1 is a schematic cross-sectional view showing the structure of a high frequency module of a preferred embodiment of the present invention.

As shown in FIG. 1, a high frequency module 1 is provided with a multilayered substrate 10, a power amplifier IC 11 mounted on an upper surface of the multilayered substrate 10, and first and second filters 12, 13 formed on an inner layer of the multilayered substrate 10.

The multilayered substrate 10 is a circuit substrate on which a wiring pattern is printed on a surface layer or an inner layer. It is preferred that the multilayered substrate 10 be a ceramic substrate having excellent heat and moisture resistance as well as good high frequency characteristics, and particularly preferred is an LTCC (Low Temperature Co-fired Ceramic) substrate. An LTCC can be co-fired at a low temperature of 900° C. or less. Therefore, Ag, Cu, and other metal materials having a low melting point and excellent high frequency characteristics can be used as the internal wiring, and a wiring pattern having low resistance loss can thereby be achieved. Also, since the wiring pattern can be formed on an inner layer, the formation of multiple layers is facilitated, and the size can be reduced and the function can be improved by housing the LC function in the multilayered substrate 10. The substrate is advantageous for mounting the power amplifier IC 11 because the heat dissipation properties are excellent.

Numerous input/output terminals are disposed in the upper and bottom surfaces of the multilayered substrate 10. In particular, input terminals 16 and output terminals 17 for the power amplifier are provided to the upper surface of the multilayered substrate 10. Input terminals 18 and output terminals 19 for the high frequency module, and ground terminals 20 are disposed on the bottom surface of the multilayered substrate 10.

The power amplifier IC 11 is a chip component (bare chip) mounted on the multilayered substrate 10. Ordinarily, the components are mounted on the surface of the multilayered substrate 10 by way of a die-bonding step, and are electrically connected to other elements by way of bonding wires and a wiring pattern formed in an inner layer or on the surface of the multilayered substrate 10.

The first filter 12 is a band-pass filter disposed in the pre-stage of the power amplifier, and the second filter 13 is a low-pass filter disposed in the post-stage of the power amplifier (see FIG. 5). In the present embodiment, it is preferred that the first filter 12 be composed of an interdigital $\lambda/4$ resonator. In accordance with the interdigital λ/4 resonator, a small, high-performance balance band-pass filter can be achieved and can easily be housed in a multilayered substrate.

The first and second filters 12, 13 are disposed substantially directly below the power amplifier IC 11. As used herein, the phrase "substantially directly below" refers to the fact that the position is not perfectly directly below. In other words, the filters may be disposed so as to be flatly superimposed on the power amplifier IC 11, or may be sufficiently superimposed so as to contribute to a smaller high frequency module 1. The level of superimposition of each of the first and second filters 12, 13 and the power amplifier IC 11 can be suitably set in accordance with the isolation and the size of the filter.

A plurality of coupling-reducing ground vias 21 is disposed between the first filter 12 and the second filter 13. When the spacing between the first filter 12 and the second filter 13 is reduced, there is a problem in that the filters electromagnetically couple and isolation is reduced. In the case that isolation of the filters is low in comparison with the gain of the power amplifier, feedback is applied to the power amplifier by way of the pre- and post-stage filters, operation of the power amplifier becomes unstable, and in the worst case, the power amplifier will oscillate.

However, in the present embodiment, a reduction in isolation can be prevented and the operation of the power amplifier can be stabilized because the coupling-reducing ground vias 21 are disposed between the first filter 12 and the second filter 13. In particular, since the coupling-reducing ground vias 21 double as power amplifier thermal vias 22, the total number of via holes can be reduced and the high frequency module can be reduced in size.

The thermal vias 22 (22a, 22b) are disposed directly below the power amplifier IC 11 in order to dissipate heat generated by the power amplifier IC 11. However, since the first and second filters 12, 13 are disposed substantially directly below the power amplifier IC 11, the thermal vias 22 of the present embodiment do not pass completely through the multilayered substrate 10, but are rather merely connected to the ground patterns 23, 24 formed in the inner layer of the multilayered substrate 10. The ground pattern 23 of the upper layer and the ground pattern 24 of the lower layer are connected by way of the coupling-reducing ground vias 21. In this manner, the coupling-reducing ground vias 21 can be made to function as thermal vias because the coupling-reducing ground vias 21 are disposed between the upper and lower thermal vias 22a, 22b.

A greater number of thermal vias are required to dissipate the heat of the power amplifier IC 11, and it is not sufficient that the coupling-reducing ground vias 21 be used as the only thermal vias. However, in the case that the first and second filters 12, 13 are disposed in the manner described above, it is difficult to provide numerous thermal vias. In view of this fact, in the present embodiment, the problem is solved by structuring the ground vias constituting the first filter 12 to double as thermal vias.

A λ/2 resonator is also known as a balance band-pass filter, but the number of ground vias in a λ/2 resonator is very low. In contrast, the interdigital λ/4 resonator constituting the first filter 12 has numerous ground vias 26 as constituted in structure. In the present embodiment, the total number of via holes can be reduced and the high frequency module can be reduced in size because the ground vias 26 are used as power amplifier thermal vias. The interdigital λ/4 resonator has the ground vias 26 and numerous interdigital electrodes, and heat can be transmitted to the interdigital electrodes as well, whereby heat can be dissipated. Therefore, a heat-dissipating effect can be obtained from the interdigital electrodes through the multilayered substrate 10.

The input terminal of the first filter 12 is connected to a high frequency module input terminal 18 on the bottom surface of the substrate by way of a via hole 27. The output terminal of the first filter 12 is connected to a power amplifier IC input terminal 16 on the upper surface of the substrate by way of wiring 28 and a via hole 29 disposed directly above the first filter 12, i.e., substantially directly below the power amplifier IC 11, and is connected to an I/O pad on the power amplifier IC 11 by way of a bonding wire 30 from the input terminal 16.

Ground patterns 23, 25 are disposed above and below the wiring 28 that connects the first filter 12 and the power amplifier IC 11. The wiring 28 is thereby constituted as a tri-plate strip line. The reason for this is described below.

A power amplifier module is a balanced input to unbalanced output-type module, and a balance filter is used as the pre-stage band-pass filter (see FIG. 5). In this case, the wiring of the balanced input must be made as short as possible inside the module because common mode noise is generated when the impedance or the length of the wiring of the balanced input of the balance filter is different. For this reason, the balanced input end of the first filter 12 must be disposed as close as possible to the high frequency module input terminal 18. As a result, the position of the unbalanced output end of the first filter 12 is on the opposite side of the balanced input end, i.e., directly below the power amplifier IC 11.

The wiring 28 between the output of the first filter 12 and the input of the power amplifier IC 11 is also disposed directly below the power amplifier IC 11, and is connected to the input end of the power amplifier IC 11 by way of the via hole 29 and the bonding wire 30. In this case, the length of the wiring of the output side of the first filter 12 is greater than that of the input side, but the effect is not as great as the balanced line. Also, the wiring 28 is a tri-plate strip line, and the tri-plate strip line has less transmission loss in comparison with other transmission lines (micro strip lines, coplanar lines, and the like). Therefore, degradation of the characteristics due to wiring can be reduced.

Next, the specific configuration of the high frequency module 1 according to the present embodiment will be described in detail.

Figure 2A:
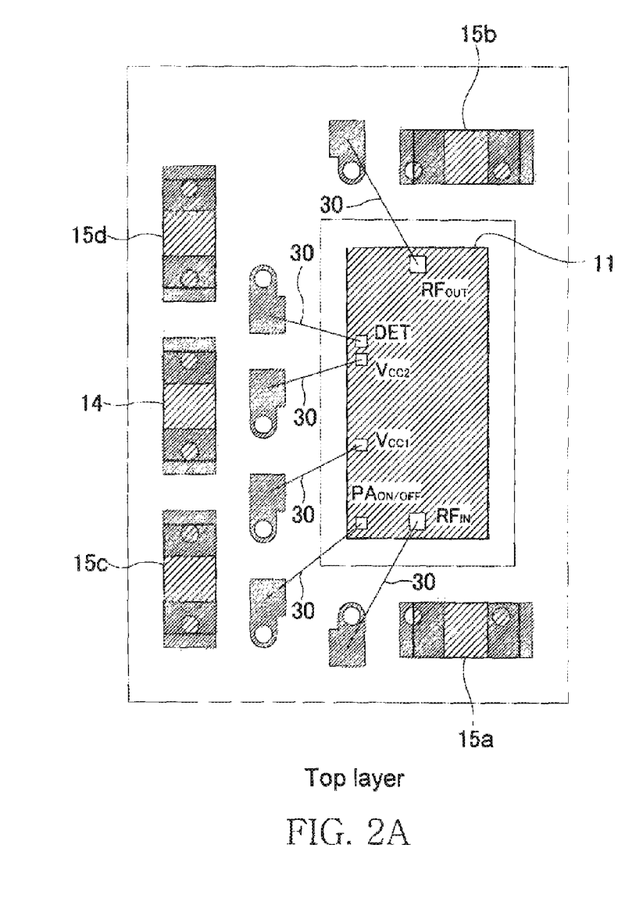
FIG. 2A is a top view of the multilayered substrate 10.
Figure 2B:
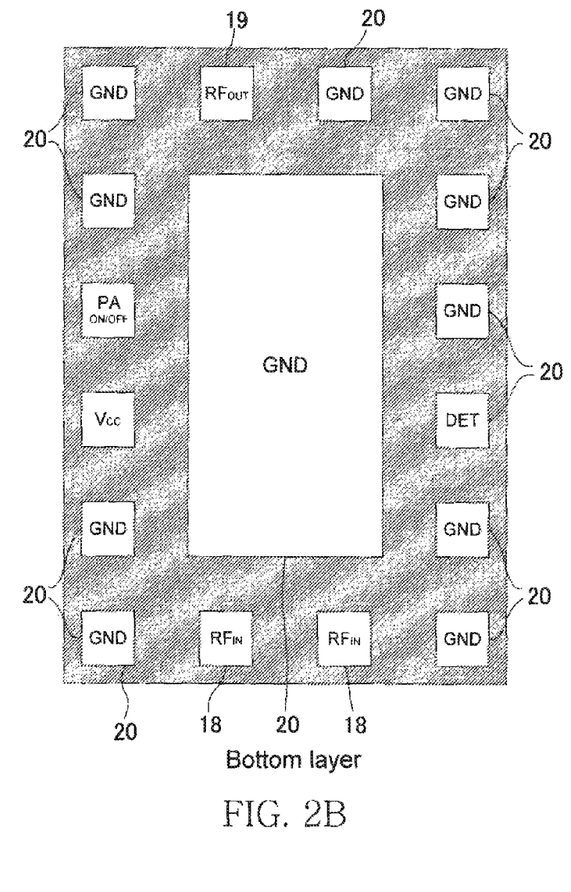
FIG. 2B is a bottom view the multilayered substrate 10.
Figure 3:
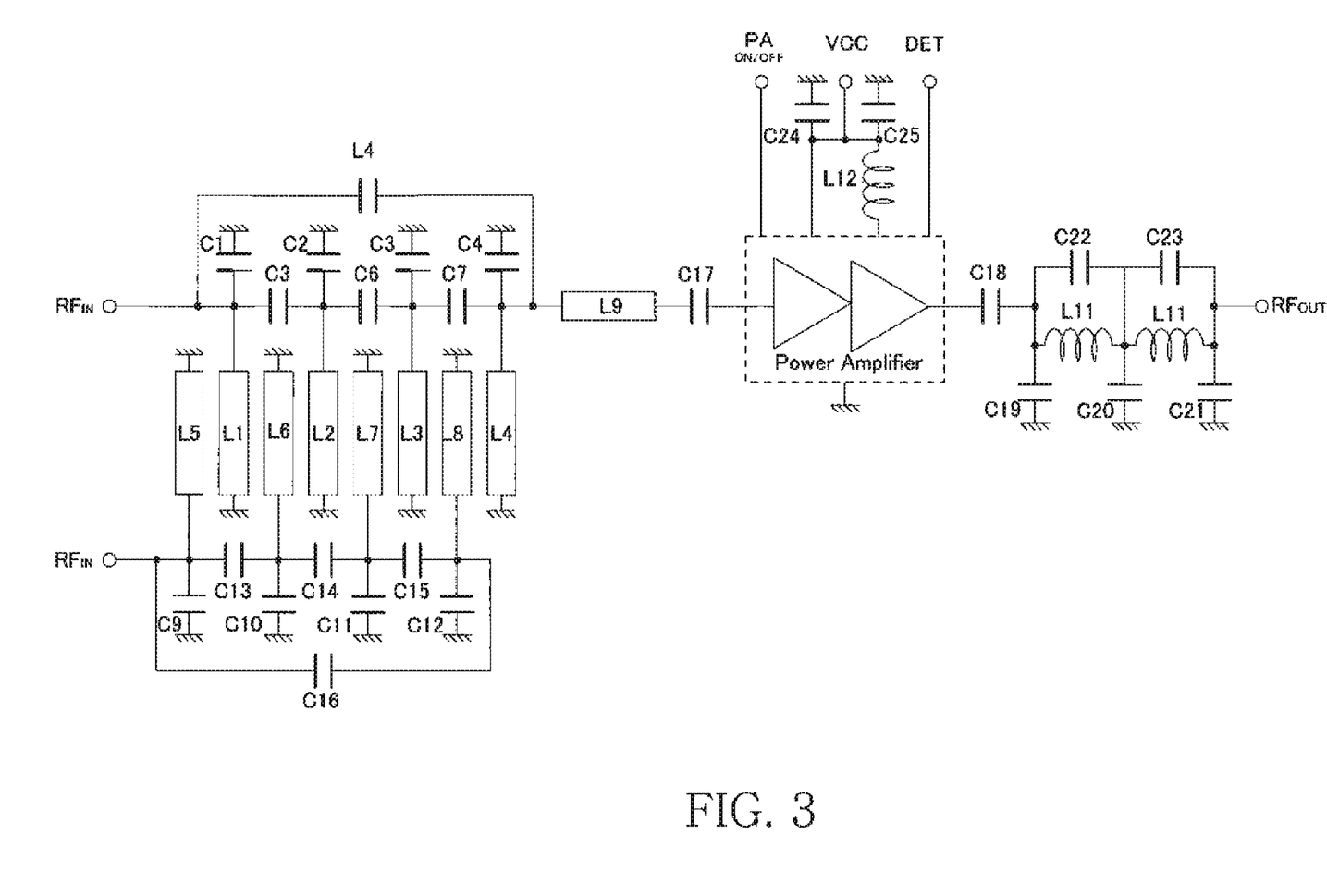
FIG. 3 is an equivalent circuit diagram of the high frequency module 1.

FIGS. 2A and 2B are plan views showing the specific configuration of the high frequency module 1, wherein FIG. 2A is a top view of the multilayered substrate 10 and FIG. 2B is a bottom view of the same. FIG. 3 is an equivalent circuit diagram of the high frequency module 1.

As shown in FIGS. 2A and 2B and FIG. 3, the high frequency module 1 has the multilayered substrate 10, and has, in addition to the power amplifier IC 11, a chip inductor 14 and chip capacitors 15a to 15d mounted on the upper surface of the multilayered substrate 10. The chip capacitors 15a, 15b are disposed on a signal line of the power amplifier; the chip inductor 14 and the chip capacitors 15c, 15d are disposed on the power source line of the power amplifier; and the chip capacitors are mounted on the multilayered substrate 10 by way of a reflow step. The chip capacitors 15a, 15b are DC blocking capacitors C17, C18 inserted between the first and second filters 12, 13 and the power amplifier IC. The chip capacitors 15c, 15d are bypass capacitors C24, C25 disposed on the power source line of the power amplifier IC 11. The chip inductor 14 is a choke coil L12 disposed on the power source line of the power amplifier. The I/O pads of the power amplifier IC 11 are connected to the corresponding I/O terminals on the multilayered substrate 10 by way of the bonding wires 30. A ground terminal is disposed in the center of the bottom surface of the multilayered substrate 10, as shown in FIG. 2B, and I/O terminals connected to power source line, the signal line, the ground electrode pattern, and the like are disposed about the periphery of the ground terminal. In particular, the large ground terminal in the center acts to assure heat-dissipating properties and connection strength.

Figure 4:
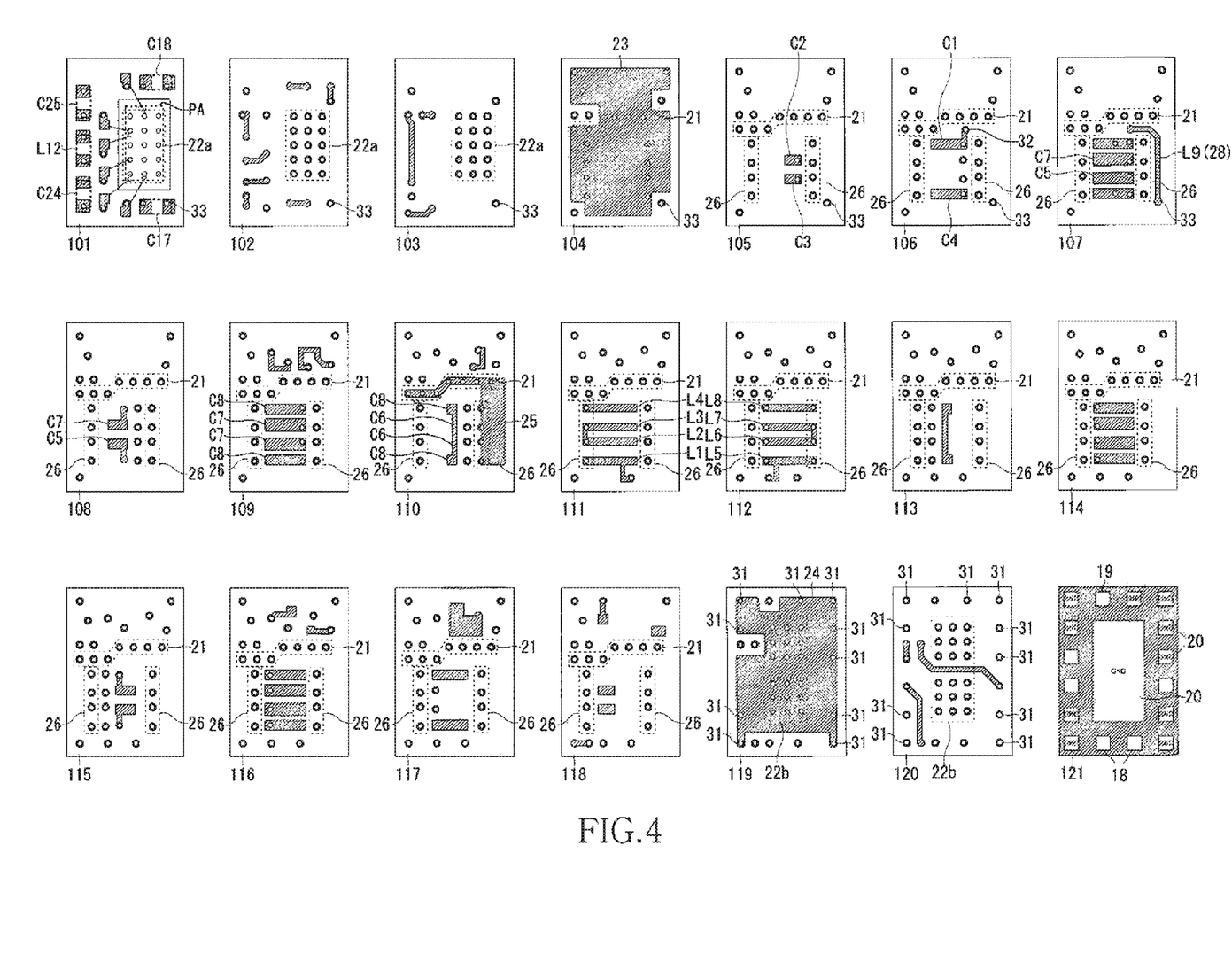
FIG. 4 is a schematic plan view showing the pattern layout of each layer of the high frequency module 1.

FIG. 4 is a schematic plan view showing the pattern layout of each layer of the high frequency module 1.

The multilayered substrate 10 of the high frequency module 1 is formed by layering 20 layers of an insulting sheet, and wiring or another conductor pattern is formed above and below the multilayered sheet and between the layers, as shown in FIG. 4. Therefore, the wiring layer has 21 layers. Specifically, first to 20th wiring layers 101 to 120 are formed on the upper surface of the first to 20th insulating sheets, respectively, and the 21st wiring layer 121 is formed on the reverse side of the 20th insulating sheet. In other words, the first wiring layer 101 is formed on the upper surface of the multilayered substrate 10, the 21st wiring layer 121 is formed on the bottom surface of the multilayered substrate 10, and the second to 20th wiring layers are formed in the inner layers of the multilayered substrate 10, respectively. The insulating sheet on which the 20th wiring layer 120 and the 21st wiring layer 121 are formed is shared. Also, via holes are formed in each wiring layer through the insulating sheets. A reference numeral is not assigned to all of the conductor patterns and via holes, but the shaded portions are the conductor pattern and the circular portions are the via holes.

Numerous thermal vias 22a are provided to the first to third wiring layers 101 to 103. The thermal vias 22a are provided below the power amplifier IC 11 and are arrayed in substantially equidistant intervals in the surface direction.

The ground pattern 23 is disposed on the fourth wiring layer 104, and the ground pattern 24 is disposed on the 19th wiring layer 119. The ground patterns 23, 24 are disposed over a wide range of the substrate surface and cover the top and bottom of the first and second filters 12, 13. The lower ends of the thermal vias 22a are connected to the ground pattern 23.

A plurality of coupling-reducing ground vias 21 is provided to the fourth to 18th wiring layers 104 to 118. The upper ends of the ground vias 21 are connected to the ground pattern 23 of the fourth wiring layer 104, and the lower ends are connected to the ground pattern 24 of the 19th wiring layer 119. The ground pattern 24 of the 19th wiring layer 119 is connected to the ground terminals 0 (GND) of the 21st wiring layer 121 by way of numerous ground vias 22b provided substantially in the center of the substrate. The ground pattern 24 is connected to other ground terminals GND as well of the 21st wiring layer 121 by way of ground vias 31 disposed in the peripheral portion of the substrate. In this manner, the coupling-reducing ground vias 21 are connected to the ground pattern.

The plurality of coupling-reducing ground vias 21 are substantially linearly arrayed along the direction orthogonal to the lengthwise direction of the multilayered substrate 10. The first filter 12 and the second filter 13 are disposed in two flat areas, respectively, partitioned by the coupling-reducing ground vias 21, and the layout of the filters is facilitated.

The area of the lower side of the coupling-reducing ground vias 21 in terms of the diagram is the format ion area of the first filter 12. The area of the upper side of the coupling-reducing ground vias 21 in terms of the diagram is the formation area of the second filter 13. The first and second filters 12, 13 are composed of the conductor patterns of the fifth to 18th wiring layers 105 to 118 as well as via holes connected thereto. In particular, the first filter 12 is composed of transmission line patterns L1 to L8 and capacitance patterns C1 to C16; and the second filter 13 is composed of inductance patterns L10 to L11 as well as capacitance patterns C19 to C23.

The thermal vias 22 disposed directly below the power amplifier IC 11 are not connected to the ground terminals 20 of the bottom surface through all of the layers in a conventional manner. However, dedicated thermal vias 22 for the power amplifier IC 11 are not required because the coupling-reducing ground vias 21 serve as thermal vias and the numerous ground vias 26 of the first filter 12 also serve as thermal vias 22.

Chip capacitors 15a, 15b are DC blocking capacitors C17, C18 and are inserted between the first and second filters 12, 13 and the power amplifier IC. A wiring pattern 28 (wiring pattern L9) connecting the output end of the first filter 12 and one end of the DC blocking capacitor C17 is disposed on the seventh wiring layer 107. The majority of the wiring pattern 28 is disposed directly below the power amplifier IC 11, one end is connected to the DC blocking capacitors by way of a via hole 33, and the other end is connected to the output end of the first filter 12 by way of a via hole 32.

The wiring pattern 28 constitutes a tri-plate strip line and a ground pattern is disposed above and below. In other words, the wiring pattern 28 is sandwiched between the ground pattern 23 of the fourth wiring layer 104 and the ground pattern 25 of the tenth wiring layer 110. The distances from the wiring pattern 28 to above the ground patterns 23, 25 are the same (a distance equal to three layers). The upper and lower ground surfaces (ground pattern 25, in this particular case) required to constitute a tri-plate strip line can be easily formed by merely connecting a predetermined conductor pattern to the ground vias 26 because the interdigital λ/4 resonator has numerous ground vias 26. In this manner, the wiring pattern 28 can be configured as a tri-plate strip line by providing the ground patterns 23, 25 above and below the wiring pattern 28, and the degradation of insertion loss brought about by an increased wiring length can be prevented.

As described above, in accordance with the high frequency module 1 of the present embodiment, isolation is not reduced even when the first filter 12 and the second filter 13 are disposed in close proximity because the first and second filters 12, 13 are disposed directly below the power amplifier IC 11, and the coupling-reducing ground vias 21 between the filters are also used as thermal vias of the power amplifier IC 11. Therefore, the module can be reduced in size overall while maintaining stable operation of the power amplifier as well as the heat-dissipating properties of the power amplifier.

In accordance with the high frequency module 1 of the present embodiment, a dedicated high frequency module 2 for the power amplifier can be dispensed with because the ground vias of the interdigital λ/4 resonator, which is the first filter 12, are also used as thermal vias of the power amplifier IC. Therefore, the first and second filters 12, 13 can be disposed directly below the power amplifier IC 11, which conventionally is the formation area of the thermal vias 22. In other words, the module can be reduced in size overall while maintaining the heat-dissipating properties of the power amplifier.

When the interdigital electrodes are used as a part of the resonance filter, the Q value can be increased while reducing the size of the resonator and I/O conversion of the balance/unbalance can be readily carried out in comparison with, e.g., an ordinary dipole or tri-pole resonance filter (see Japanese Laid-open Patent Application No. 2007-235435). Furthermore, the structure has numerous (four pair (eight) in the present embodiment) interdigital electrodes in comparison with an ordinary resonance filter, since these are all connected to a ground electrode, the heat-dissipating effect can be further enhanced by connecting the thermal vias to the interdigital electrodes.

In accordance with the high frequency module 1 of the present embodiment, wiring 28 for connecting the input end of the power amplifier IC 11 and the output end of the interdigital λ/4 resonator, which is the first filter 12, is disposed directly below the power amplifier IC 11, and since the wiring 28 is configured as a tri-plate strip line, impedance matching between the power amplifier IC 11 and the first filter 12 can be reliably achieved. Even were the impedance matching to be lost between the power amplifier IC 11 and the first filter 12, impedance matching between the power amplifier IC 11 and the first filter 12 can be easily adjusted without changing the element value of the filter as long as the height from the tri-plate strip line to ground is adjusted and the characteristic impedance is varied.

The present invention has thus been shown and described with reference to specific embodiments. However, it should be rioted that the present invention is in no way limited to the details of the described arrangements but changes and modifications may be made without departing from the scope of the appended claims.

For example, in the embodiments described above, an interdigital λ/4 resonator is used as the first filter 12, but the present invention is not limited to an interdigital λ/4 resonator, and various filter structures can be used. The filter in this case is preferably provided with as many ground vias as possible.

The interdigital λ/4 resonator is not limited to the circuit structure shown in FIGS. 2 and 3, and a configuration is also possible in which all or part of the capacitance [patterns] C1 to C16 are omitted, for example.

In the embodiments described above, the first and second filters 12, 13 are disposed substantially directly below the power amplifier IC 11, but the present invention is not limited to thereto, and any element may be disposed below the power amplifier IC.

In the embodiments described above, the capacitors C17, C18 are disposed between pre- and post-stage filters 12, 13 and the power amplifier IC 11, but in the present invention, these capacitors are not required to be provided. A capacitor or another circuit element may be disposed in the pre-stage of the first filter 12 and the post-stage of the second filter 13.

The high frequency module according to the present invention is not limited to a circuit configuration composed of the first filter 12, the power amplifier IC 11, and the second filter 13, and may be used as a portion of a large-scale high frequency module integrated with an RF antenna switch circuit part such as that described in, e.g., Japanese Laid-open Patent Application No. 2006-157880.

What is claimed is:

1. A high frequency module, comprising:
   a multilayered substrate;
   a power amplifier IC mounted on an upper surface of the multilayered substrate;
   first and second filters disposed substantially directly below the power amplifier IC in an inner layer of the multilayered substrate; and
   coupling-reducing ground vias disposed between the first filter and the second filter, wherein
   at least the first filter is disposed substantially directly below the power amplifier IC, and
   the coupling-reducing ground vias double as thermal vias for dissipating heat generated by the power amplifier IC.

2. The high frequency module as claimed in claim 1 further comprising a ground pattern formed in an inner layer of the multilayered substrate, wherein the coupling-reducing ground vias are connected to the ground pattern.

3. The high frequency module as claimed in claim 1, wherein the first filter is connected to an input end of the power amplifier IC, and the second filter is connected to an output end of the power amplifier IC.

4. The high frequency module as claimed in claim 1, wherein the first filter be composed of a ¼wavelength (λ/4) resonator in which an interdigital electrode is used.

5. The high frequency module as claimed in claim 1, wherein the second filter is disposed substantially directly below the power amplifier IC.

6. The high frequency module as claimed in claim 1, wherein the first filter has a plurality of ground vias, and the ground vias double as thermal vias for dissipating heat generated by the power amplifier IC.

7. The high frequency module as claimed in claim 6, wherein the ground vias are connected to the ground pattern.

8. The high frequency module as claimed in claim 1, further comprising a wiring pattern provided in an inner layer of the multilayered substrate and connecting between the output end of the first filter and the input end of the power amplifier.

9. The high frequency module as claimed in claim 8, wherein the wiring pattern is constituted as a tri-plate strip line.

10. A high frequency module comprising:
    a multilayered substrate;
    a power amplifier IC mounted on an upper surface of the multilayered substrate;
    a first ground pattern formed in a first inner layer of the multilayered substrate;
    a plurality of first thermal vias that are connected between a bottom surface of the power amplifier IC and the first ground pattern and that are configured to dissipate heat generated by the power amplifier IC;
    a first filter disposed substantially directly below the power amplifier IC in a second inner layer of the multilayered substrate such that at least a portion of the first filter is disposed below at least one of the plurality of first thermal vias, wherein
    the first filter has a plurality of ground vias connected to the first ground pattern,
    the plurality of ground vias double as second thermal vias for dissipating heat generated by the power amplifier IC,
    only one ends of the plurality of the first thermal vias are connected to the bottom surface of the power amplifier IC, and
    the other ends of the plurality of the first thermal vias are connected to the first ground pattern.

11. The high frequency module as claimed in claim 10, wherein an output end of the first filter is connected to an input end of the power amplifier IC.

12. The high frequency module as claimed in claim 10, wherein the first filter is composed of a ¼wavelength (λ/4) resonator in which an interdigital electrode is used.

13. The high frequency module as claimed in claim 10, further comprising:
    a ground terminal provided on a bottom surface of the multilayered substrate;
    a second ground pattern formed in a third inner layer of the multilayered substrate;
    a plurality of third thermal vias that are connected between the ground terminal and the second ground pattern; wherein one ends of the plurality of the third thermal vias are connected to the ground terminal, the other ends of the plurality of the third thermal vias are connected to the second ground pattern, and the plurality of the third thermal vias are thermally connected to the plurality of the first thermal vias through the plurality of the ground vias provided in the power amplifier IC.

14. The high frequency module as claimed in claim 10, wherein the plurality of the first thermal vias are arrayed in equidistant intervals in the surface direction of the multilayered substrate.

15. A high frequency module, comprising:
a multilayered substrate;
a power amplifier IC mounted on an upper surface of the multilayered substrate;
a first filter disposed substantially directly below the power amplifier IC in an inner layer of the multilayered substrate; and
a wiring pattern provided in an inner layer of the multilayered substrate and connecting between the output end of the first filter and the input end of the power amplifier, wherein the first filter is a balance filter having a balanced input end and an unbalanced output end, a position of the unbalanced output end is closer to a center of the multilayered substrate than a position of the balanced input end in a surface direction of the multilayered substrate, and the wiring pattern is disposed substantially directly below the power amplifier IC.

16. The high frequency module as claimed in claim 15, wherein the wiring pattern is constituted as a tri-plate strip line.

17. The high frequency module as claimed in claim 15, wherein the unbalanced output end of the first filter is connected to an input terminal formed on the upper surface of the multilayered substrate through the wiring pattern and a via hole electrode, the input terminal is connected to a pad formed on an upper surface of the power amplifier IC through a bonding wire.

18. The high frequency module as claimed in claim 17, wherein the input terminal is provided around the power amplifier IC on the upper surface of the multilayered substrate.

* * * * *